United States Patent

Kawamura

[11] Patent Number: 6,140,865
[45] Date of Patent: Oct. 31, 2000

[54] SEMICONDUCTOR INTEGRATED CIRCUIT DEVICE WITH A STABLE OPERATING INTERNAL CIRCUIT

[75] Inventor: Yasunori Kawamura, Kyoto, Japan

[73] Assignee: Rohm Co., Ltd., Kyoto, Japan

[21] Appl. No.: 09/225,496

[22] Filed: Jan. 6, 1999

[30] Foreign Application Priority Data

Feb. 12, 1998 [JP] Japan .................................. 10-029761

[51] Int. Cl.[7] .................................................. H03B 1/00
[52] U.S. Cl. .......................... 327/551; 327/379; 327/382
[58] Field of Search .................................. 327/551, 365, 327/379, 382

[56] References Cited

U.S. PATENT DOCUMENTS

| | | | |
|---|---|---|---|
| 4,783,603 | 11/1988 | Goforth | 326/71 |
| 5,315,187 | 5/1994 | Cheng | 327/384 |
| 5,444,402 | 8/1995 | McMahon et al. | 327/170 |

*Primary Examiner*—Timothy P. Callahan
*Assistant Examiner*—Hai L. Nguyen
*Attorney, Agent, or Firm*—Arent Fox Kintner Plotkin & Kahn PLLC

[57] ABSTRACT

A semiconductor integrated circuit device has an output circuit composed of a P-channel transistor whose source is connected to a terminal for receiving a supplied voltage and an N-channel transistor whose source is connected to a terminal for receiving a ground voltage, with the node between the drains of the two transistors used as the output terminal of the output circuit. A capacitive circuit element is connected between the sources of the two transistors, and thus in parallel with the output circuit, so as to suppress variations that occur in the current supplied from the supplied power as a result of a current being fed through the output circuit to or from a load connected to the output terminal. This helps keep constant the voltage that is supplied to an internal circuit that is connected in parallel with the output circuit, and thereby stabilize the operation of the internal circuit.

6 Claims, 5 Drawing Sheets

SEMICONDUCTOR INTEGRATED CIRCUIT DEVICE WITH A STABLE OPERATING INTERNAL CIRCUIT

BACKGROUND OF THE INVENTION

1. Field of the Invention

The present invention relates to a semiconductor integrated circuit device having an internal circuit and an output circuit that operate on the same source of electric power.

2. Description of the Prior Art

FIG. 8 shows an example of the circuit configuration of a conventional semiconductor integrated circuit device. As shown in this figure, in this device, both an internal circuit 10 and an output circuit 20 operate on the same supplied voltage $V_{DD}$ fed from a common electric power source. The output circuit 20 is built as a CMOS inverter circuit composed of a P-channel MOSFET (metal-oxide semiconductor field-effect transistor) 21 and an N-channel MOSFET 22 (hereafter a MOSFET is referred to simply as a "transistor"). The gates of these P-channel and N-channel transistors 21 and 22 are connected together, and their node is connected to the input terminal IN of the output circuit 20. The source of the P-channel transistor 21 is connected to a terminal D, which is in turn connected to the supplied voltage $V_{DD}$. The source of the N-channel transistor 22 is connected to a terminal G, which is in turn connected to ground GND. The drains of the P-channel and N-channel transistors 21 and 22 are connected together, and their node is connected to the output terminal OUT of the output circuit 20

According to this circuit configuration, when the potential at the input terminal IN turns to a low level, the P-channel transistor 21 is turned on, and the N-channel transistor 22 is turned off, with the result that the potential at the output terminal OUT turns to a high level (equal to the supplied voltage $V_{DD}$). By contrast, when the potential at the input terminal IN turns to a high level, the P-channel transistor 21 is turned off, and the N-channel transistor 22 is turned on, with the result that the potential at the output terminal OUT turns to a low level (equal to the ground level).

Now, consider a case where, as shown in FIG. 8, a capacitive load 50 is connected to the output terminal OUT of the conventional semiconductor integrated circuit device described above. When the potential at the input terminal IN of the output circuit 20 turns from a high level to a low level, an electric current flows from the supplied voltage $V_{DD}$ through the P-channel transistor 21 so as to charge the load capacitance $C_K$. By contrast, when the potential at the input terminal IN of the output circuit 20 turns from a low level to a high level, an electric current flows through the N-channel transistor 22 to ground GND so as to discharge the load capacitance $C_K$.

Moreover, it is inevitable that, as shown in FIG. 8, small parasitic resistances $R_D$ and $R_G$ exist across the power lines, i.e. on the one hand along the path from the supplied voltage $V_{DD}$ to the branch node A between the internal circuit 10 and the output circuit 20, and on the other hand along the path from the confluence node B between the internal circuit 10 and the output circuit 20 to ground.

From the descriptions given above, it will be understood that, as the potential at the input terminal IN of the output circuit 20 turns from a high level to a low level, the current flowing through the resistance $R_D$ increases, and the current flowing through the resistance $R_G$ decreases; by contrast, as the same potential turns from a low level to a high level, the current flowing through the resistance $R_D$ decreases, and the current flowing through the resistance $R_G$ increases. In this way, every time the potential at the input terminal IN of the output circuit 20 changes its level, the currents that flow through the resistances $R_D$ and $R_G$ fluctuate, causing variations in the voltage on which the internal circuit 10 operates and thus destabilizing the operation of the internal circuit 10.

It is to be noted that, the greater the load capacitance connected to the output terminal OUT, for example as a result of a number of capacitive loads being connected in parallel to the output terminal OUT, and the higher the current capacity of the P-channel or N-channel transistor 21 or 22, the larger the currents that flow to charge and discharge the load capacitance, and therefore the more serious the effect of the problem. The same is true when a number of output circuits change their output level simultaneously.

SUMMARY OF THE INVENTION

An object of the present invention is to provide a semiconductor integrated circuit device that ensures stable operation of an internal circuit that operates on the same source of electric power as an output circuit.

To achieve the above object, according to the present invention, a semiconductor integrated circuit device is provided with: a supplied power terminal for receiving electric power; an internal circuit that operates on the electric power supplied thereto via the supplied power terminal; an output circuit that operates on the electric power supplied thereto via the supplied power terminal; and a capacitive circuit element that is connected midway along the power supply path laid from the supplied power terminal to the output circuit and that acts to allow the electric current that occurs as the output circuit is turned on and off to be supplied to and from an output terminal via the output circuit.

In this circuit configuration, connecting a capacitive circuit element in the manner described above makes it possible to supply the current for the charging/discharging of the load capacitance also from the capacitive circuit element. This helps reduce the charge/discharge current required to be supplied from the supplied power terminal. As a result, it is possible to keep constant the current that flows from the supplied power terminal to the power supply path, and thereby reduce the effect on the internal circuit of the variations caused in the supplied voltage by the operation of the output circuit.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
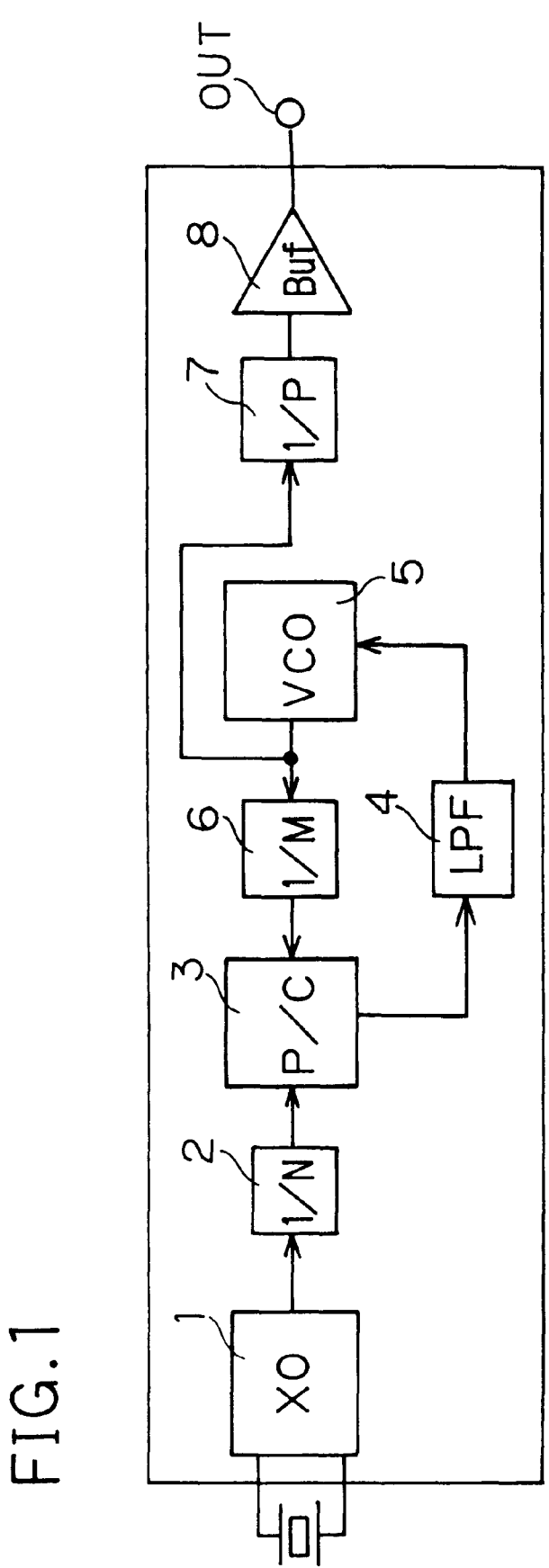
FIG. 1 is a block diagram of a clock generator taken up as an example of a semiconductor integrated circuit device embodying the invention.

Hereinafter, embodiments of the present invention will be described with reference to the attached drawings. The following descriptions deal with clock generators as examples of semiconductor integrated circuit devices, because they typically include a large number of synchronously operating output circuits and thus tend to suffer instantaneous flows of large electric current. FIG. 1 is a block diagram of a clock generator taken up as an example of a semiconductor integrated circuit device embodying the invention. In this device, a phase comparator 3, a low-pass filter 4, and a voltage-controlled oscillator 5 constitute a phase-locked loop (PLL). A crystal oscillator 1 generates a clock signal. This clock signal is first subjected to 1/N frequency division by a frequency divider 2, and then fed to the phase comparator 3. The output of the voltage-controlled oscillator 5 is, on the one hand, subjected to 1/M frequency division by another frequency divider 6 and then fed to the phase comparator 3, and, on the other hand, subjected to 1/P frequency division by still another frequency divider 7 and then fed to a buffer (output circuit) 8. In this circuit configuration, if the oscillation frequency of the crystal oscillator 1 is assumed to be $f_X$, then the output frequency $f_{OUT}$ of the clock generator is given by $f_{OUT}=f_X \times M/N \times 1/P$.

Figure 2:
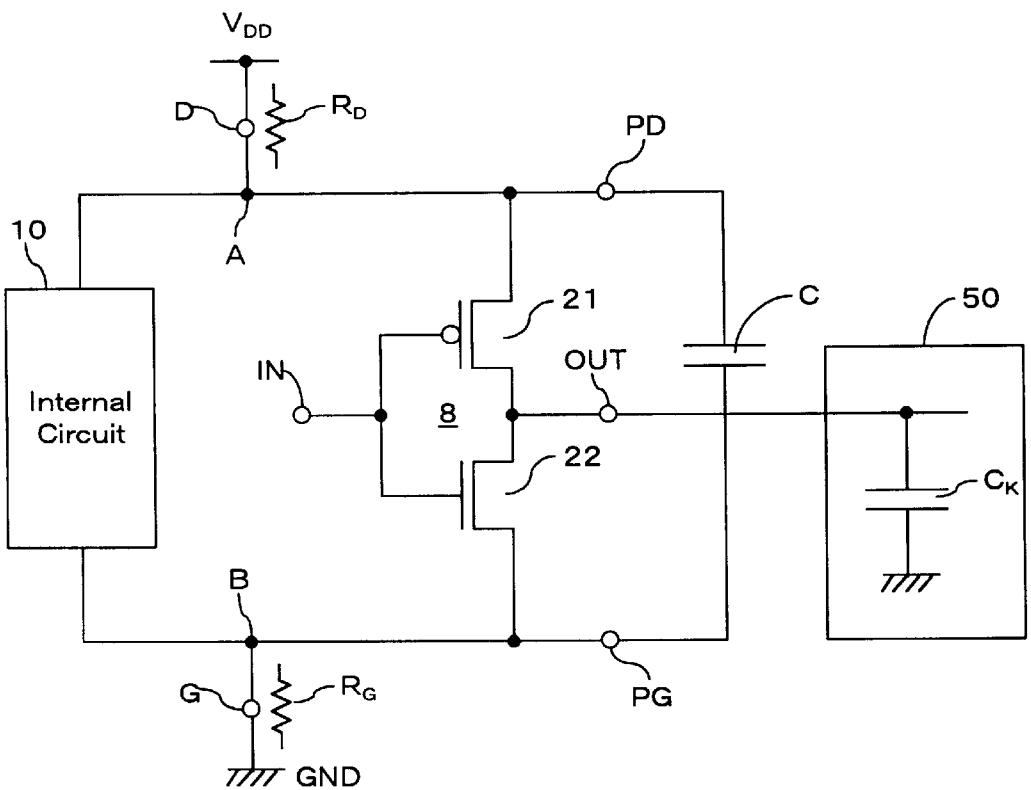
FIG. 2 is a diagram showing an example of the circuit configuration of and around the buffer.

As shown in FIG. 2, in essence, the buffer 8 has the same configuration as the output circuit 20 provided in the conventional semiconductor integrated circuit device described previously. The only difference is that, in the embodiment under discussion, the buffer 8 is additionally provided with terminals PD and PG that are connected to the sources of a P-channel transistor 21 and an N-channel transistor 22 respectively. These terminals PD and PG permit a predetermined circuit element to be connected between them, and thereby allow it to be connected directly in parallel with the buffer 8 with respect to the supplied power. Note that, in the clock generator of this embodiment, the crystal oscillator 1, phase comparator 3, low-pass filter 4, and voltage-controlled oscillator 5 act as an internal circuit 10 that operates on the same supplied power as the buffer 8 acting as an output circuit.

Now, consider a case where, as shown in FIG. 2, a capacitor C is connected between the terminals PD and PG, and a capacitive load 50 is connected to the output terminal OUT. Here, assume that the capacitor C is fitted externally, and that the load has a capacitance $C_K$ that exists parasitically within the load itself, and therefore that the capacitor C has a capacitance sufficiently high relative to the load capacitance $C_K$. Assume also that the capacitor C has already been charged by the supplied voltage $V_{DD}$.

Figure 3:
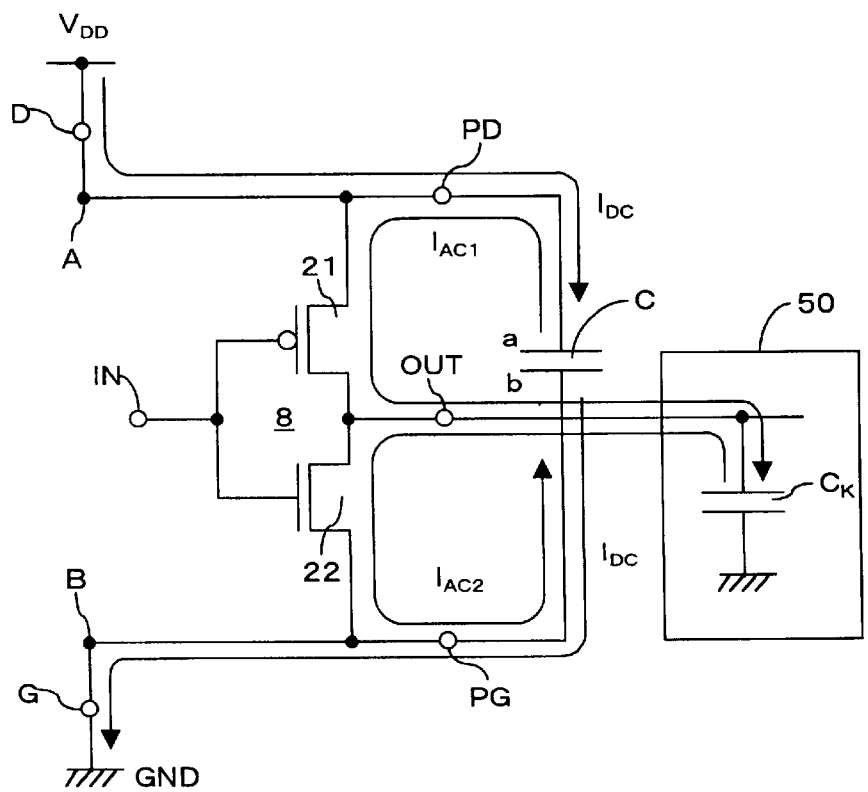
FIG. 3 is a diagram illustrating the relationship between the buffer and the load.

Now, with reference to FIG. 3, how this semiconductor integrated circuit device operates will be described. FIG. 3 is a circuit diagram illustrating the relationship between the buffer 8 of the semiconductor integrated circuit device, the capacitor C, and the load 50 connected to the output terminal OUT. Let the current that flows from the supplied power so as to charge the capacitor C be $I_{DC}$. When the potential at the input terminal IN of the buffer 8 turns from a high level to a low level, a charge current flows so as to charge the load capacitance $C_K$. This charge current is supplied by a current $I_{AC1}$ that flows to discharge the electric charge accumulated on the positive electrode a of the capacitor C via the terminal PD. As a result, the potential at the capacitor C drops, and thus causes the charge current $I_{DC}$ to flow from the supplied power. At this time, to keep constant the amount of electric charge accumulated in the capacitor C, the current $I_{AC1}$ is kept equal to the current $I_{DC}$, with the result that the current $I_{DC}$, which flows so as to charge the capacitor C, appears to flow as a current that charges the load capacitance $C_K$.

When the potential at the input terminal IN of the buffer 8 turns from a low level to a high level, a discharge current flows so as to discharge the load capacitance $C_K$. This discharge current produces a current $I_{AC2}$ that flows into the negative electrode b of the capacitor C. As a result, the potential at the negative electrode b of the capacitor C rises, and thus causes the charge current $I_{DC}$ to flow from the supplied power. At this time, to keep constant the amount of electric charge accumulated in the capacitor C, the current $I_{AC2}$ is kept equal to the current $I_{DC}$, with the result that the current $I_{DC}$, which flows so as to charge the capacitor C, appears to flow as a current that is caused by the discharging of the load capacitance $C_K$.

As described above, while the buffer 8 is operating, a constant current $I_{DC}$ is kept flowing from the supplied power to the capacitor C and the buffer 8, and this prevents variations in the currents that flow through the resistances $R_D$ and $B_G$. In this way, it is possible to suppress variations in the voltage on which the internal circuit 10 operates. This helps enhance the stability with which the internal circuit 10 operates when a capacitive load 50 is connected, and thus, in the case of the clock generator of this embodiment, obtain a stable clock signal.

Figure 4:
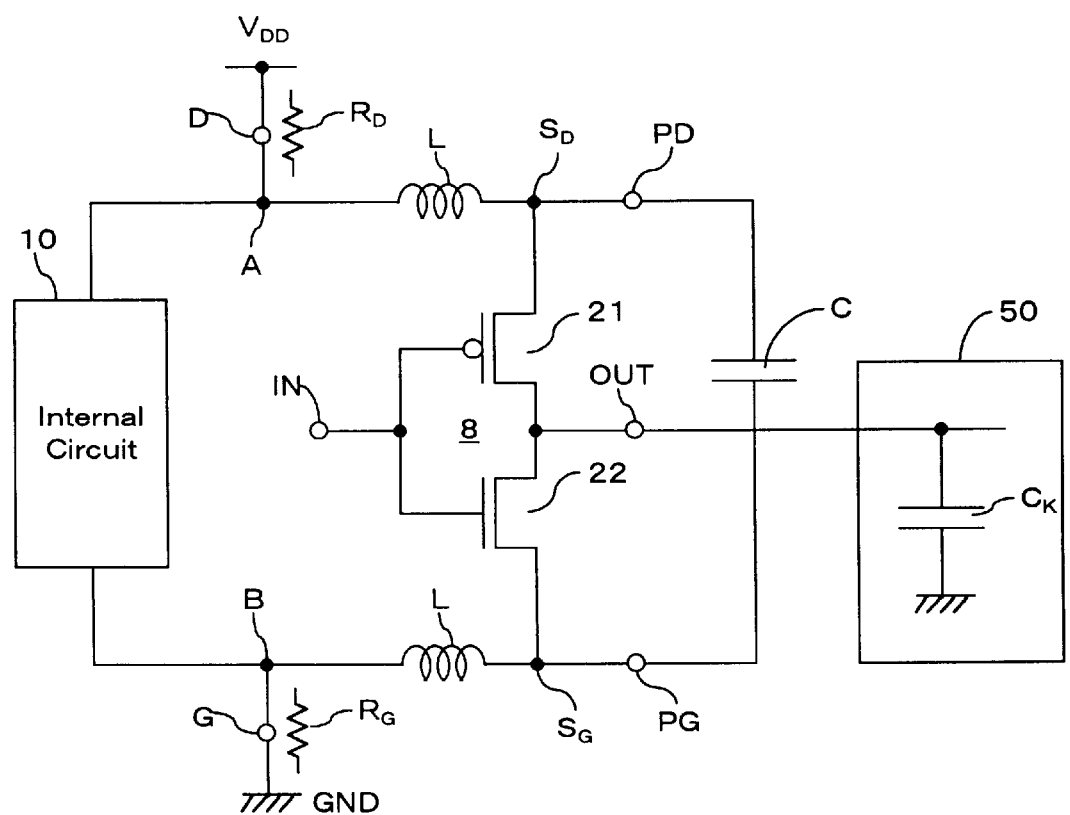
FIG. 4 is a diagram showing another example of the circuit configuration of and around the buffer.

As shown in FIG. 4, it is also possible to additionally provide inductances L expressly between the buffer 8 and the supplied power, i.e. in the path from each of the nodes $S_D$ and $S_G$ between the buffer 8 and the capacitor C to the nodes A and B respectively. Since an inductance exhibits a high resistance against a high-frequency component, this helps ensure that the high-frequency component in the current charging/discharging the load capacitance $C_K$ is absorbed by the capacitor C, and thus further enhance the operation stability of the internal circuit.

Figure 5:
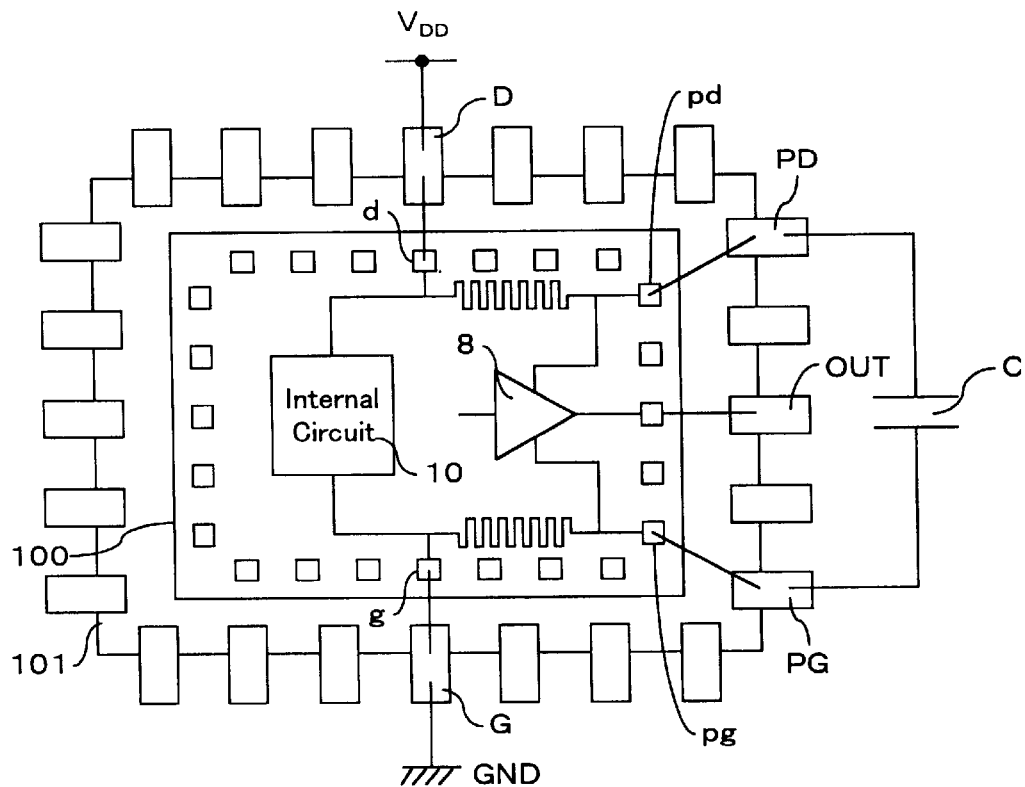
FIG. 5 is a top view of a semiconductor integrated circuit device embodying the invention, as seen before its semiconductor chip is sealed.

FIG. 5 illustrates the structure of the IC chip on which the above semiconductor integrated circuit device is formed and how the IC chip is sealed in a package. In this figure, a pad d conducts to a pin D, which is connected to the supplied voltage $V_{DD}$; a pad g conducts to a pin G, which is connected to ground GND; pads pd and pg conduct to pins PD and PG respectively, and serve to supply electric power to the buffer 8; the capacitor C is connected between the pins PD and PG. The pads, d, g, pd, and pg, the internal circuit 10, and the buffer 8 are formed within an IC chip 100. The pins D, G, PD, and PG are provided in a package 101 that seals the IC chip 100. The pins are made to conduct to their corresponding pads by wire bonding. To obtain a high inductance between the pads d and pd, and also between the pads g and pg, for example a narrow aluminum conductor is used there, and the conductor is formed in a zigzag or other intricate pattern so as to be made sufficiently long.

Figure 6:
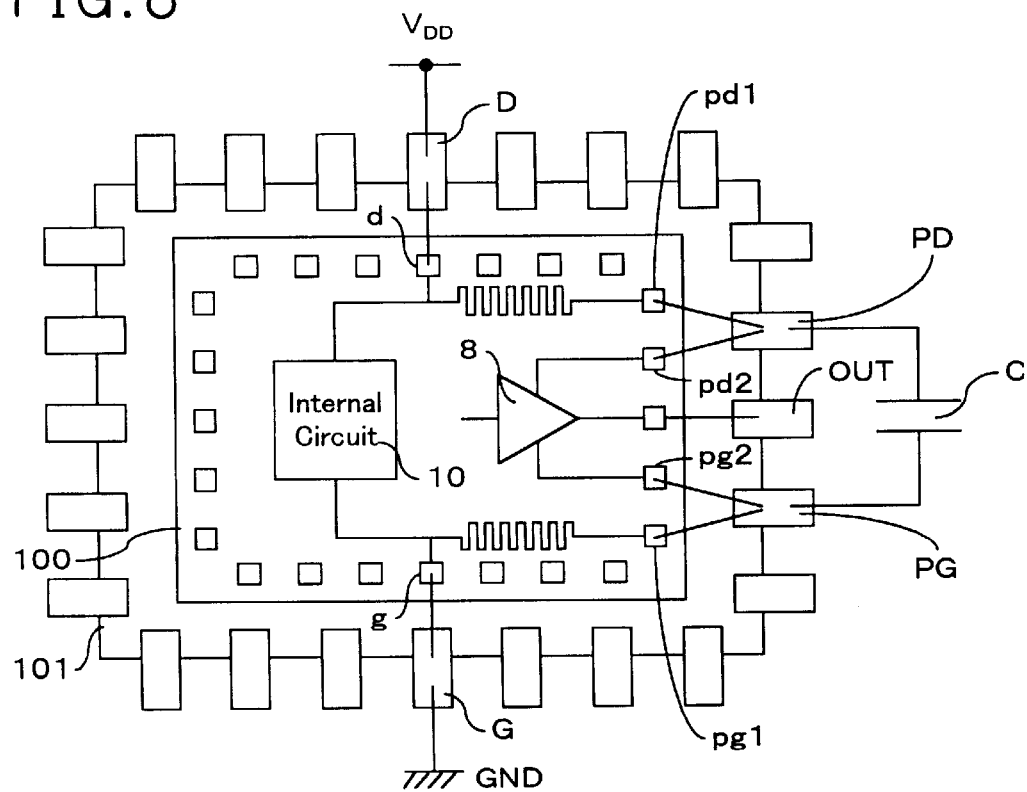
FIG. 6 is a top view of another semiconductor integrated circuit device embodying the invention, as seen before its semiconductor chip is sealed.

In wire-bonding the pads to the pins, it is allowed to bond two wires to each pin. Therefore, it is also possible to adopt a structure as shown in FIG. 6. In this figure, pads pd1 and pg1 are connected to the pads d and g respectively in such a way that a high inductance is obtained in between; on the other hand, pads pd2 and pg2 are used to supply electric power to the buffer 8; the pads pd1 and pd2 are wire-bonded to the pin PD, and the pads pg1 and pg2 are wire-bonded to the pin PG.

Since the wires with which the pads are wire-bonded to the pins have their own inductances, this structure (FIG. 6) is more effective, than the structure described previously (FIG. 5), in making sufficiently low the inductance that exists between the buffer 8 and the capacitor C relative to the inductance that exists between the buffer 8 and the supplied power.

As shown in FIGS. 5 and 6, the capacitor C is fitted between the pins PD and PG externally, i.e. outside the package 101. If a significant parasitic capacitance exists on the wiring to the capacitor C, it will inconveniently act to cancel out the inductance L provided between the supplied power and the buffer 8. For this reason, it is desirable that the pins PD and PG be so arranged as to allow the capacitor C to be connected to them with shortest possible wires (i.e. with a lowest possible inductance between the buffer 8 and the capacitor C). Accordingly, it is also possible to seal the capacitor C, too, inside the package 101, with the capacitor C directly wire-bonded to the pads.

Figure 7:
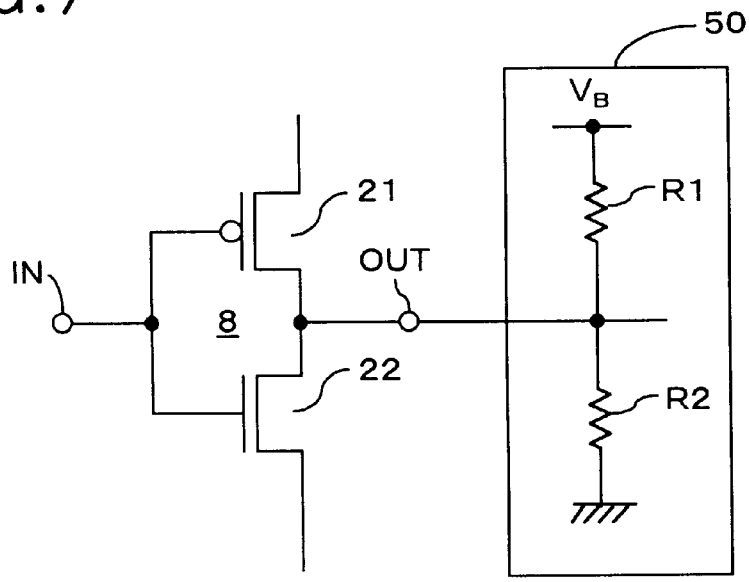
FIG. 7 is a diagram showing an example of the load connected to the output circuit.
Figure 8:
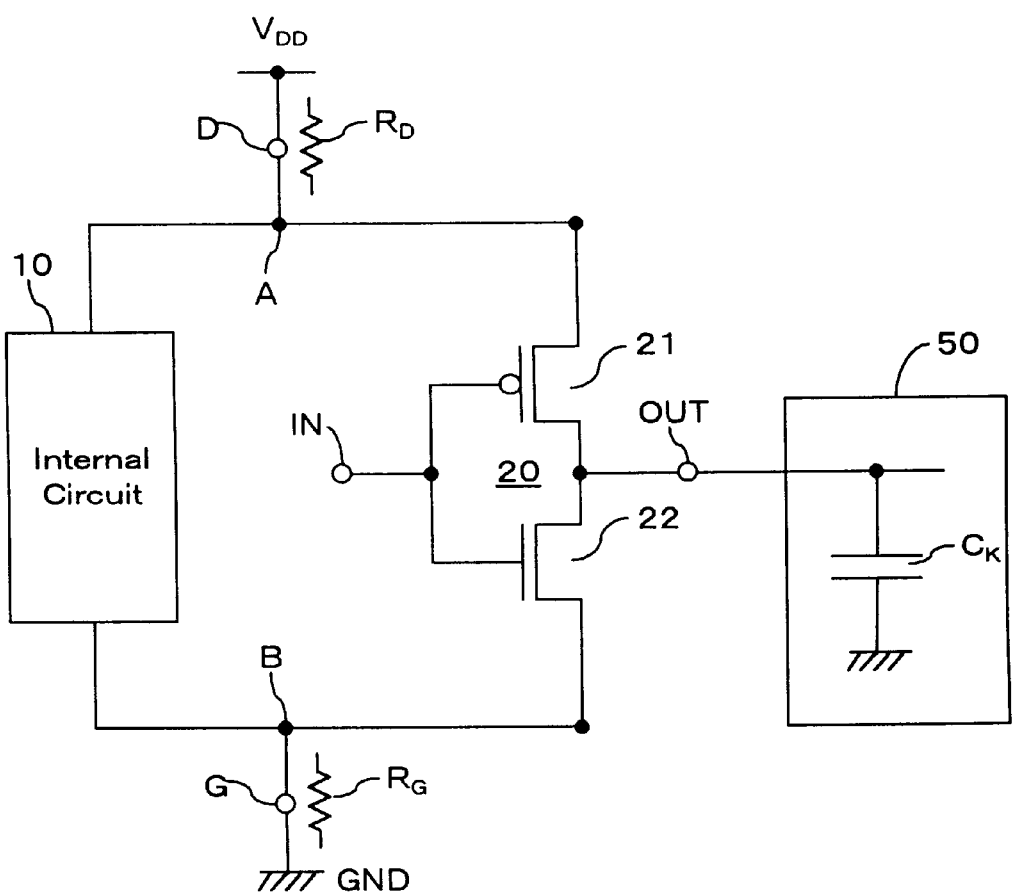
FIG. 8 is a diagram showing an example of a conventional semiconductor integrated circuit device.

It is to be understood that the present invention can be practiced in many other ways than is specifically described above, and can be applied to semiconductor integrated circuit devices designed for any function, as long as they include an internal circuit and an output circuit that operate on the same source of electric power. It is also to be understood that, although the above descriptions deal only with cases that involve a capacitive load 50, the load 50 may be of a type that, as shown in FIG. 7, has two resistors R1 and R2 connected in series between a potential $V_B$ and ground GND, with the node between the resistors R1 and R2 connected to the output terminal OUT of the buffer 8. In cases that involve this type of load 50, when the signal fed to the input terminal IN of the buffer 8 is at a high level, a current flows from the output terminal OUT to the resistor R2; by contrast, when the signal fed to the input terminal IN of the buffer 8 is at a low level, a current flows from the resistor R1 to the output terminal OUT.

As described above, according to the present invention, in a semiconductor integrated circuit device having an internal circuit and an output circuit that operate on the same source of electric power, it is possible to suppress variations that are caused, every time a large instantaneous current flows in the output circuit, in the voltage on which the internal circuit operates. Thus, it is possible to enhance the stability of the operation of such an internal circuit.

What is claimed is:

1. A semiconductor integrated circuit device comprising:
    a first supplied power terminal pin for receiving a first supplied voltage from an external power supply circuit;
    a second supplied power terminal pin for receiving a second supplied voltage from an external power supply circuit;
    a first and a second supplied power terminal pad connected to said first and second supplied power terminal pins respectively;
    an internal circuit connected to said first and second supplied power terminal pads;
    an output circuit connected to said first and second supplied power terminal pads;
    a first pad provided midway along a power supply path laid from said first supplied power terminal pad to said output circuit;
    a second pad provided midway along a power supply path laid from said second supplied power terminal pad to said output circuit;
    a first and a second pin connected to said first and second pads respectively;
    a capacitive circuit element that is, by being connected to said first and second pins, connected externally in parallel with said output circuit; and
    conductors formed in such a zigzag pattern as to lengthen said power supply paths.

2. A semiconductor integrated circuit device as claimed in claim 1,
    wherein said pads, power supply paths, internal circuit, and output circuit are formed within a semiconductor chip,
    wherein said pins are provided in a package that is formed so as to seal said semiconductor chip, and
    wherein said capacitive circuit element is connected to said first and second pins outside said package.

3. A semiconductor integrated circuit device as claimed in claim 1,
    wherein said pads, power supply paths, internal circuit, and output circuit are formed within a semiconductor chip,
    wherein said pins are provided in a package that is formed so as to seal said semiconductor chip, and
    wherein said capacitive circuit element is sealed inside said package.

4. A semiconductor integrated circuit device comprising:
    a first supplied power terminal pin for receiving a first supplied voltage from an external power supply circuit;
    a second supplied power terminal pin for receiving a second supplied voltage from an external power supply circuit;
    a first and a second supplied power terminal pad connected to said first and second supplied power terminal pins respectively;
    an internal circuit connected to said first and second supplied power terminal pads;
    a first and a second pad connected to said first and second supplied power terminal pads respectively;
    a first and a second pin connected to said first and second pads respectively;
    a third and a fourth pad connected to said first and second pins respectively;
    an output circuit connected to said third and fourth pads;
    a capacitive circuit element that is, by being connected to said first and second pins, connected in parallel with said output circuit and connected also to an external circuit; and
    conductors connecting between said first supplied power terminal pad and said first pad and between said second supplied power terminal pad and said second pad respectively, said conductors being formed in such a pattern as to lengthen their own path lengths.

5. A semiconductor integrated circuit device as claimed in claim 4,
    wherein said pads, power supply paths, internal circuit, and output circuit are formed within a semiconductor chip,
    wherein said pins are provided in a package that is formed so as to seal said semiconductor chip, and
    wherein said capacitive circuit element is connected to said first and second pins outside said package.

6. A semiconductor integrated circuit device as claimed in claim 4,
    wherein said pads, power supply paths, internal circuit, and output circuit are formed within a semiconductor chip,
    wherein said pins are provided in a package that is formed so as to seal said semiconductor chip, and
    wherein said capacitive circuit element is sealed inside said package.

* * * * *